(12) United States Patent
van Veldhoven et al.

(10) Patent No.: US 10,014,873 B1
(45) Date of Patent: Jul. 3, 2018

(54) RESISTOR LADDER DIGITAL-TO-ANALOG CONVERTER WITH MISMATCH CORRECTION AND METHOD THEREFOR

(71) Applicant: NXP B.V., Eindhoven (NL)

(72) Inventors: Robert van Veldhoven, Valkenswaard (NL); Rui Quan, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/714,230

(22) Filed: Sep. 25, 2017

(51) Int. Cl.
*H03M 1/66* (2006.01)
*H03M 1/06* (2006.01)
*H03M 1/78* (2006.01)

(52) U.S. Cl.
CPC ......... *H03M 1/0604* (2013.01); *H03M 1/785* (2013.01)

(58) Field of Classification Search
CPC .......................... H03M 1/0604; H03M 1/785
USPC ................................................ 341/144, 154
See application file for complete search history.

(56) References Cited

U.S. PATENT DOCUMENTS

| 4,459,580 A * | 7/1984 | Furukawa ............... H03M 1/74 341/144 |
| 6,621,440 B2 | 9/2003 | Gorman |
| 7,605,740 B2 * | 10/2009 | Pelgrom ............. H03M 1/0673 341/155 |
| 7,939,936 B2 * | 5/2011 | Uno ..................... H01L 23/3128 257/672 |
| 8,717,216 B1 | 5/2014 | Motamed |
| 9,425,816 B1 * | 8/2016 | Yang ..................... H03M 1/066 |
| 2016/0056834 A1 | 2/2016 | Frank |

OTHER PUBLICATIONS

Baird, R. T., et al. "Improved ΔΣ DAC Linearity Using Data Weighted Averaging" 1995 IEEE International Symposium on Circuits and Systems, Year, vol. 1, pp. 13-16, May 1995.
Sakina, Y. "Multi-bit ΔΣ Analog-to-Digital Converters with Nonlinearity Correction Using Dynamic Barrel Shifting" M.A. Thesis, Memorandum No. UCB/ERL M93/63, College of Engineering, University of California, Berkeley, May 1990.
Temes, Gabor C., "Dynamic Matching and Mismatch Shaping" Oregon State University, EECS, Spring 2016.

\* cited by examiner

*Primary Examiner* — Brian Young

(57) ABSTRACT

A digital-to-analog converter (DAC) includes a plurality of resistive elements connected together in series to form a ring of resistive elements. A node is formed by each of the connections of adjacent resistive elements of the ring. Groups of parallel-connected switches are coupled to each node. A first switch of the group of switches is for selectively coupling a first power supply voltage terminal to the node. A second switch of the group of switches is for selectively coupling a second power supply voltage to the node. A third switch of the group of switches is for selectively coupling an output terminal to the node. A differential or single-ended analog output may be provided. Mismatch induced error is removed using a mismatch error shaping technique that shapes the errors outside a pass-band.

19 Claims, 3 Drawing Sheets

BEFORE ROTATION

AFTER ROTATION

RESISTOR LADDER DIGITAL-TO-ANALOG CONVERTER WITH MISMATCH CORRECTION AND METHOD THEREFOR

BACKGROUND

Field

This disclosure relates generally to electrical circuits, and more specifically, to a resistor ladder digital-to-analog converter (DAC) with mismatch correction and method therefor.

Related Art

One type of resistor ladder DAC (digital-to-analog converter) includes a plurality of resistors connected together in series between a first reference voltage terminal and a second reference voltage terminal. This type of DAC may also be known as a Kelvin divider or string DAC. An output terminal, or output node, in series with a switch is located at a connection between each resistor. A control terminal of each of the switches receives one bit of a digital value that will turn on one of the switches so that an analog output voltage corresponding to the digital value is provided. It may be intended that each of the plurality of resistors have the same resistance value, but factors such as process variations and temperature changes may cause the resistance values of the resistors to differ. The resistance mismatches may cause inaccuracies or distortion to appear in the analog output voltage.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
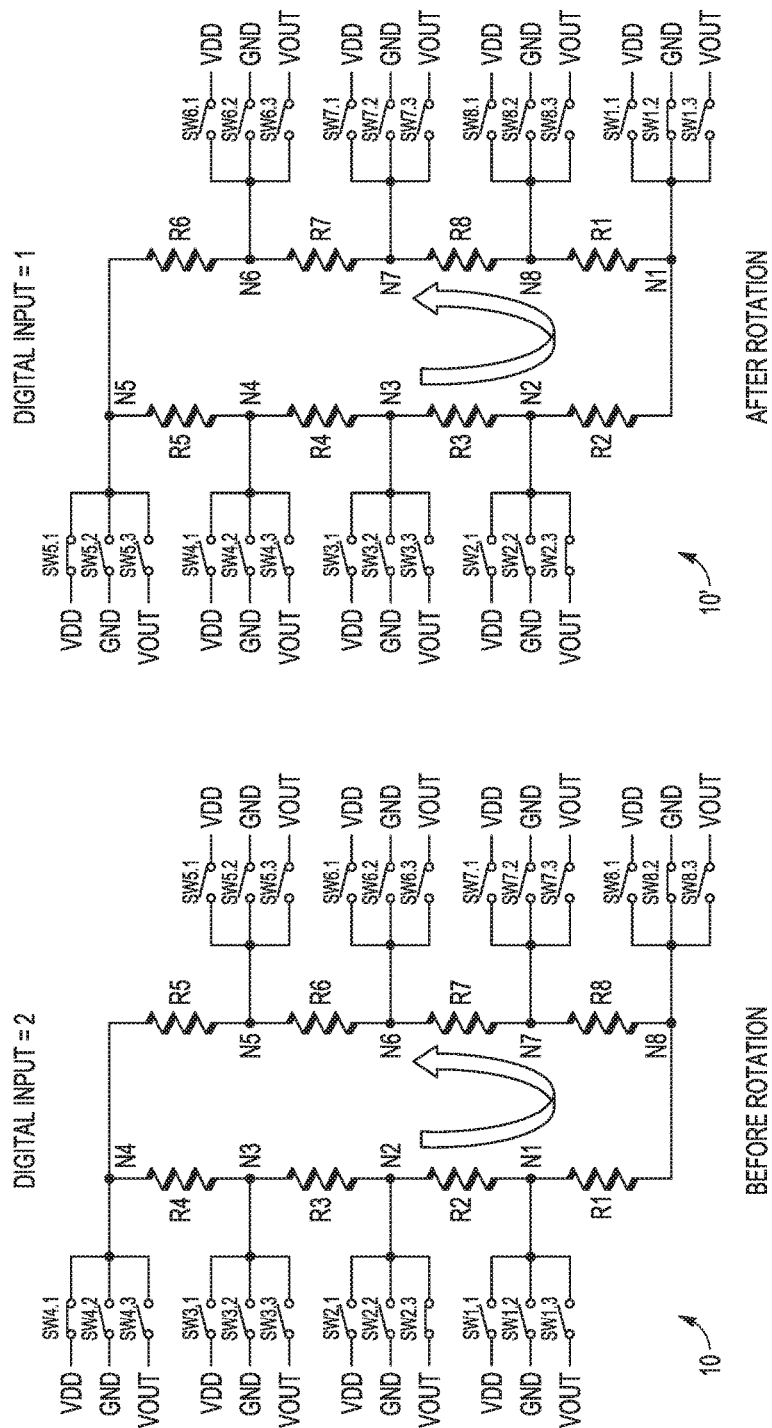
FIG. 1 illustrates a resistor ladder DAC with a single-ended output, and example switch positions before and after applying barrel shifting mismatch correction in accordance with an embodiment.

Generally, there is provided, a resistor ladder DAC. The resistor ladder includes a plurality of series-connected resistive elements connected together in loop or ring. A node, or tap, between each of the resistive elements provides an input/output terminal for the resistor ladder. A plurality of terminals is coupled to each node, each terminal being coupled to the node through a switch. A first terminal may be for receiving a first reference voltage. A second terminal may be for receiving a second reference voltage. A third terminal may function as an output terminal for the analog voltage. In one embodiment, the resistor ladder analog output voltage is single-ended. In another embodiment, the resistor ladder analog output voltage is differential. A method is provided to correct for mismatched resistance values in the resistive elements. This mismatch induced error is removed by barrel shifting, data weighted average, or other mismatch error shaping technique that shapes or spreads the errors outside of a pass-band. Also, in one embodiment, the mismatch error is further controlled by regulating the first and second reference voltages. To regulate the first and second reference voltages, an amplifier may be included to control mismatch induced in-band noise caused by the switches.

In one embodiment, there is provided, a digital-to-analog converter (DAC) including: a plurality of series-connected resistive elements connected together to form a ring of resistive elements; a first plurality of switches, each switch of the first plurality of switches having a first terminal and a second terminal, the first terminal of each of the first plurality of switches coupled to a corresponding node between adjacent resistive elements of all of the plurality of series-connected resistive elements, and the second terminal of each switch of the first plurality of switches coupled to receive a first reference voltage; a second plurality of switches, each switch of the second plurality of switches having a first terminal and a second terminal, the first terminal of each of the second plurality of switches coupled to a corresponding node between adjacent resistive elements of all of the series-connected resistive elements, and the second terminal of each switch of the first plurality of switches coupled to receive a second reference voltage; and a third plurality of switches, each switch of the third plurality of switches having a first terminal and a second terminal, the first terminal of each of the third plurality of switches coupled to a corresponding node between adjacent resistive elements of all of the series-connected resistive elements, and the second terminal of each switch of the third plurality of switches coupled to provide an analog voltage at an output terminal in response to a digital value. The plurality of series-connected resistive elements may include an even number of resistive elements. The digital value may be characterized as being a digital thermometer code. The first reference voltage may be a power supply voltage, and the second reference voltage may be ground potential. The plurality of series-connected resistive elements may be characterized as being a plurality of series-connected equal valued resistors. The analog voltage may be a differential analog voltage. The DAC may further include: a fourth plurality of switches, each switch of the fourth plurality of switches having a first terminal and a second terminal, the first terminal of each of the fourth plurality of switches coupled to a corresponding node between adjacent resistive elements of the series-connected resistive elements, and the second terminal of each switch of the fourth plurality of switches coupled to provide a second analog voltage at a second output terminal in response to the digital value, the analog voltage and the second analog voltage together providing a differential analog voltage. The DAC may further include: a fourth plurality of switches, each switch of the fourth plurality of switches having a first terminal and a second terminal, the first terminal of each of the fourth plurality of switches coupled to a corresponding node between adjacent resistive elements of the series-connected resistive elements; and an amplifier having a first input terminal coupled to receive a third reference voltage, a second input terminal, and an output terminal for providing the first reference voltage, the output terminal of the amplifier selectively coupled to the second terminal of one of the first plurality of switches and to the second input terminal. Nodes between the adjacent resistive elements may be reassigned to different locations in the ring of resistive elements by rotating the nodes by a predetermined number of node positions.

In another embodiment, there is provided, a digital-to-analog converter (DAC) including: a plurality of resistive elements connected together in series to form a ring of resistive elements, a node being formed by each of the connections of adjacent resistive elements of the plurality of resistive elements; and a plurality of groups of switches, each of the groups of switches coupled to one node formed between the adjacent resistive elements of all of the plurality of resistive elements, a first switch of each of the group of switches for selectively coupling a first power supply voltage terminal to the node to which it is coupled, a second switch of the group of switches for selectively coupling a second power supply voltage to the node to which it is coupled, and a third switch of the group of switches for selectively coupling an output terminal to the node to which it is coupled. The group of switches may further include a fourth switch for selectively coupling a second output terminal to the node to which it is coupled, wherein the output terminal and the second output terminal selectively providing a differential analog output voltage in response to a digital value. The DAC may further include an amplifier selectively coupled to the first switch for providing a regulated first power supply voltage to the first power supply voltage terminal. Nodes between the adjacent resistive elements of the plurality of resistive elements may be reassigned to different locations in the ring of resistive elements by rotating the nodes by a predetermined number of node positions. The predetermined number of node positions may be equal to one. The plurality of resistive elements may be characterized as being a plurality of series-connected equal value resistors.

In yet another embodiment, there is provided, a method for operating a digital-to-analog converter (DAC), the DAC including a plurality of resistive elements coupled together in series to form a ring of resistive elements with a ring of nodes, each node of the ring of nodes at a corresponding connection between resistive elements of the plurality of resistive elements, the method comprising: selectively coupling a first node of the ring of nodes to a first power supply voltage terminal; selectively coupling a second node of the ring of nodes to a second power supply voltage terminal; selectively coupling a third node of the ring of nodes to output a first analog voltage corresponding to a first digital input value; re-assigning each of the first node, the second node, and the third node to different locations in the ring of resistive elements by rotating the first, second, and third nodes by a predetermined number of nodes, wherein the first node is a new first node, the second node is a new second node, and the third node is a new third node; selectively coupling the new first node of the nodes to the first power supply voltage terminal; selectively coupling the new second node of the nodes to the second power supply voltage terminal; and selectively coupling the new third node of the nodes to output a second analog voltage corresponding to a second digital input value. Rotating the first, second, and third nodes by a predetermined number of nodes may further include rotating the first, second, and third nodes by one node in a predetermined direction. Rotating the first, second, and third nodes by a predetermined number of nodes may further include the predetermined number of nodes corresponding to the first digital input value. The method may further include regulating a first power supply voltage provided to the first power supply voltage terminal, and regulating a second power supply voltage provided to the second power supply voltage terminal. The first and second analog voltages may each be characterized as being a differential analog voltage.

FIG. 1 illustrates resistor ladder DAC (digital-to-analog converter) 10 using only a single-ended output, and example switch positions before and after applying barrel shifting mismatch correction in accordance with an embodiment. DAC 10 may also be characterized as being a Kelvin divider or string DAC. In FIG. 1, in accordance with an embodiment, DAC 10 includes a plurality of series-connected resistors arranged in a ring, or loop. As a simple example, eight resistors are illustrated in FIG. 1. In other embodiments, the number of resistors may be different depending on the desired bit resolution. The resistors are labeled R1-R8, and nodes between resistors are labeled N1-N8. DAC 10 includes a plurality of groups of switches. A group of switches is connected to each of the nodes. As an example, in FIG. 1, three switches are connected together at each node. Each of the switches has a control terminal for receiving a control signal for controlling the switch. The control signals may be provided by control logic (not shown) for controlling the DAC. At node N1, a first switch is labeled 1.1 and has a first terminal connected to node N1, and a second terminal. The first switch is used to selectively connect a first reference voltage labeled VDD from the second terminal to node N1. A second switch labeled 1.2 is used to selectively connect a second power supply voltage labeled GND to node N1. In one embodiment, the first reference voltage is a power supply voltage and the second reference voltage is ground. In other embodiments, the first and second reference voltages may be different. A third switch is labeled 1.3 and is used to selectively provide a single-ended analog output voltage labeled VOUT from node N1 in response to a digital value provided to a control terminal of switch 1.3. Each of the other nodes N2-N8 are connected to pluralities of switches as illustrated. Using the switches the reference voltages VDD and GND can be assigned to any of the terminals and any of the nodes can be connected as the analog voltage output so that there is no limitation on how DAC 10 can be configured. In one embodiment the resistors of the ring of resistors all have substantially the same resistance value. In addition, the resistors can be some other type of device that can provide a voltage drop across the device. Also, because the resistors are organized into two legs by the connections of the switches to the first and second reference voltages, there should be an even number of resistors so that the two legs are symmetrical. This may be more important in the case where a differential output is used.

The illustrated arrangement of resistors as a ring facilitates the use of mismatch correction algorithms that reduce or eliminate the effect of mismatches in the resistance values. Operation of DAC 10 is illustrated by showing two operating cycles labeled "BEFORE ROTATION" and one labeled "AFTER ROTATION".

Illustrated in FIG. 1 is one example of the operation of DAC 10. During operation of the example illustrated in FIG. 1, first reference voltage VDD is provided to node N4 via switch 4.1 and ground (GND) is connected to node N8 via switch 8.2. This effectively divides the ring of resistors into two legs of series-connected resistors between VDD and ground, where a first leg includes resistors R1-R4 and a second leg includes resistors R5-R8. Each of the switches have a control terminal (not shown) for controlling the opening and closing of the switch. In one embodiment, each of the switches are implemented as a transistor. A digital input value is provided to the control terminals of the switches that connect to output terminal VOUT, that is, switches labeled 1.3, 2.3, 3.3, 4.3, 5.3, 6.3, 7.3, and 8.3 in FIG. 1 are connected to VOUT for providing a voltage in response to a control signal. Only one of the switches is closed during any one operating cycle. The digital value is provided to the nodes in order of node N1 to node N4. In the illustrated example, the VOUT switch corresponding to the input digital value in DAC 10 is the output. In one embodiment, the digital value is in thermometer code format. A decoder (not shown) may be provided to convert a binary value to thermometer code. As an example, a digital value of the number two (2) is provided to the control terminals of the switches of DAC 10. In thermometer code, the digital value of the number two (0010) would result in switch 2.3 closing and the rest of the switches remaining open. The series-connected resistors provide a voltage divider and the analog voltage VOUT is determined by the resistor ratios. In this single-ended example and where the digital input code is two, output voltage VOUT is $$VOUT = \frac{R1 + R2}{R1 + R2 + R3 + R4}(VDD - GND)$$

wherein R1, R2, R3, and R4 are the resistance values of the resistors with the same name in FIG. 1.

Prior to the next operating cycle of DAC 10, the nodes of the bit positions are rotated in accordance with a rotating scheme sometimes referred to as "barrel shifting" to change the nodes by a predetermined number of node positions. In FIG. 1, this is illustrated by rotating the node labels and resistor labels. The location of the bit positions of the plurality of switches rotates around the ring a predetermined number of positions each time a conversion is made. In the illustrated embodiment, the bit positions are rotated by one position counterclockwise. A curved arrow in FIG. 1 illustrates the counterclockwise rotation. In other embodiments, the rotation direction of node and resistor reassignment around the ring of resistors may be clockwise. In FIG. 1, DAC 10' illustrates the node and resistor positions after the rotation. Node N1 is now located one position counterclockwise where node N8 was before rotation. The other nodes rotate accordingly one bit position counterclockwise. Also, note that the switch reference numbers rotate with their corresponding nodes. Power supply voltage VDD is provided to node N5 via switch 5.1 and ground is provided to node N1 via switch 1.2, as indicated by switches 5.1 and 1.2 being closed. A first leg between VDD and GND now includes resistors R2-R5 and a second leg includes resistors R6, R7, R8, and R1. DAC 10 is ready for another operating cycle.

In the next operating cycle, illustrated as DAC 10' on the right side of FIG. 1, a second input digital value is a one (1). The node corresponding to the output in this operating cycle is located at node N2. In thermometer code, the second input digital value may be 0001. Switch 2.3 is closed by the thermometer code value, thus connecting node N2 to VOUT. The output voltage VOUT at node N2 is $$VOUT = \frac{R2}{R2 + R3 + R4 + R5}(VDD - GND)$$

Operation continues with the nodes rotating as illustrated after every operating cycle. Rotating the bit positions to each possible position using barrel shifting turns mismatch distortion into a white noise floor. The approach illustrated in FIG. 1 using barrel shifting can also be used to provide a differential output voltage instead of a single-ended output voltage. Providing a differential output voltage would require one additional switch at each node to create a positive output voltage in one leg and a negative output voltage in the other leg as illustrated in FIG. 2 and discussed below.

Figure 2:
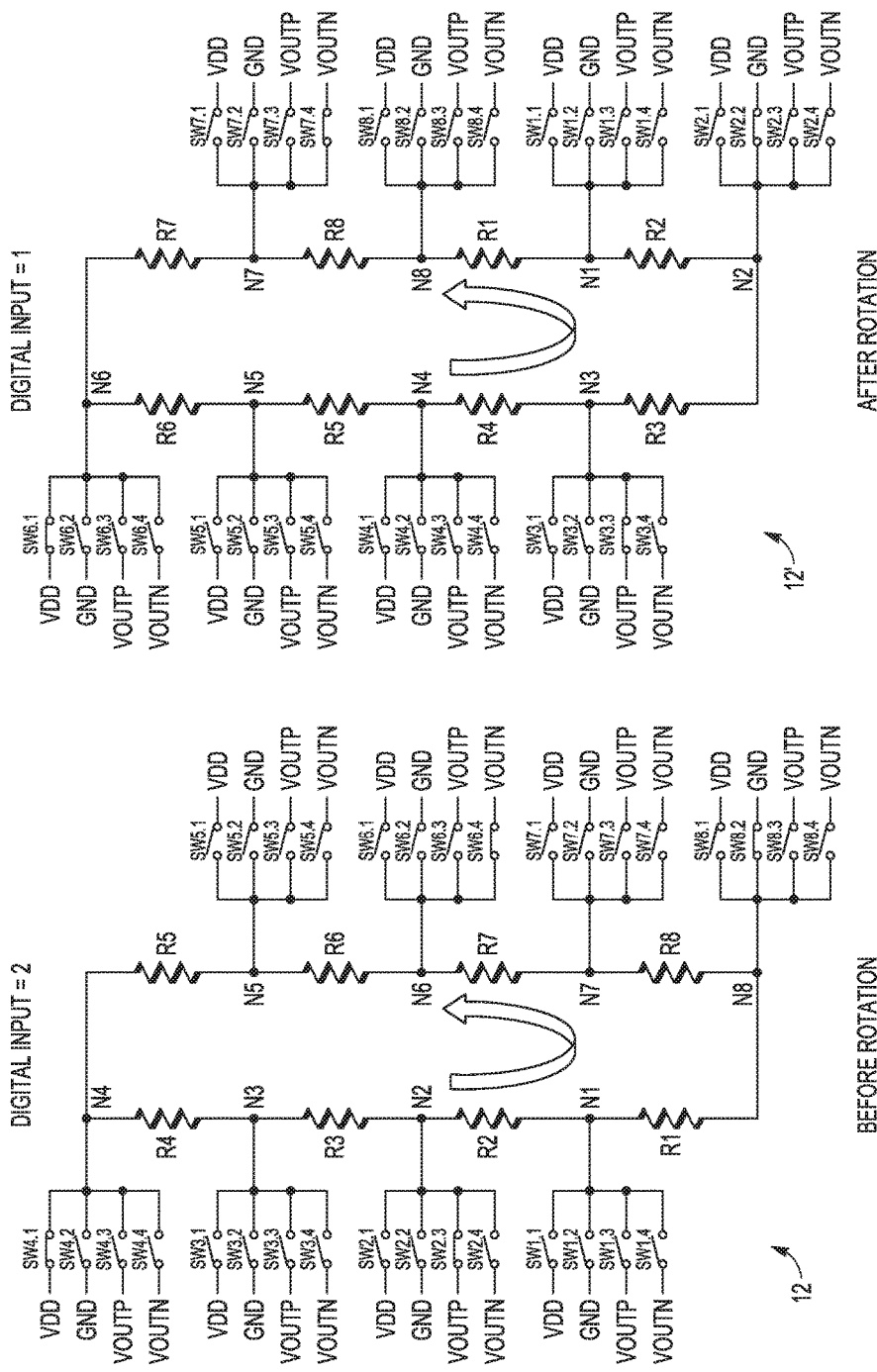
FIG. 2 illustrates resistor ladder DAC with a differential output, and example switch positions before and after applying data weighted averaging in accordance with an embodiment.

FIG. 2 illustrates resistor ladder DAC 12 with differential outputs, and example switch positions before and after applying data weighted averaging (DWA) in accordance with an embodiment. DAC 12 includes a plurality of series-connected resistors arranged in a ring, or loop. For the purposes of simplicity and clarity, eight resistors are illustrated in FIG. 2. In other embodiments, the number of resistors may be different depending on the desired bit resolution. Like DAC 10 illustrated in FIG. 1, the resistors of DAC 12 are labeled R1-R8, and the nodes between the resistors are labeled N1-N8. A plurality of switches are connected in series with each node and an output terminal. DAC 12 is similar to DAC 10 except that two output terminals are selectively connected to the nodes to accommodate the differential outputs. At node N1, a first switch is labeled 1.1 and has a first terminal connected to node N1, and a second terminal. The first switch is used to selectively connect first reference voltage VDD from the second terminal of switch 1.1 to node N1. A second switch labeled 1.2 is used to selectively connect a second reference voltage GND (ground) to node N1. A third switch is labeled 1.3 and is used to selectively provide an output voltage labeled VOUTP from node N1 in response to a digital value provided to a control terminal of switch 1.3. A fourth switch is labeled 1.4 and is used to selectively provide an output voltage labeled VOUTN from node N1 in response to a digital value provided to a control terminal of switch 1.3. Output voltages VOUTP and VOUTN together determine the differential output voltage where the differential output voltage VOUT=VOUTP−VOUTN. The pluralities of switches for each of the other nodes N2-N8 are connected similarly to the plurality of switches connected to node N1. Node N2 is connected to a plurality of switches 2.1-2.4, node N3 is connected to a plurality of switches 3.1-3.4, through to node N8 which is connected to switches 8.1-8.4. By controlling the switches, the reference voltages VDD and GND can be assigned to any of the terminals and any of the nodes can be connected as the analog output voltages VOUTP and VOUTN. A DAC control circuit (not shown) is used to control the switches. In one embodiment, the resistors of the ring of resistors, illustrated in FIG. 2, all have substantially the same resistance value. In another embodiment, the resistance values may be binary weighted, or have some other resistance value relationship.

As discussed above for FIG. 1, connecting the resistors together in a ring facilitates the use of mismatch correction algorithms that reduce or eliminate the effect of mismatches in resistances values. Operation of DAC 12 is illustrated by showing two operating cycles labeled "BEFORE ROTATION" and one labeled "AFTER ROTATION".

During a first operating cycle (BEFORE ROTATION), as an example, first reference voltage VDD is provided to node N4 via switch 4.1 and ground (GND) is connected to node N8 via switch 8.2. This effectively divides the ring of resistors forming the resistor ladder into two legs of series-connected resistors between VDD and ground, where a first leg includes resistors R1-R4 and a second leg includes resistors R5-R8. In this example, a digital input value for the number two (2) is provided. A decoder may be used to convert from binary to thermometer code. In thermometer code for the two legs having four resistors each, the number two (0010) would result in switch 2.3 closing in the first leg and 6.4 closing in the second leg and the rest of the switches remaining open. Therefore, in the first leg, node N2 is one of the differential outputs and in the second leg, node N6 is the other differential output. At the output terminals, voltages VOUTP and VOUTN are provided. The actual analog voltage VOUT corresponding to the number two (2) is determined by the difference of the output voltages VOUTP and VOUTN.

Prior to a second operating cycle, the locations of the bit positions are rotated in accordance with the DWA rotating scheme. In DWA, the nodes are rotated by a number determined by the previous data value. In this case, the data value was equal to two in the first operating cycle, so the nodes are rotated by two nodes in a counterclockwise direction as illustrated in DAC 12' (AFTER ROTATION). A curved arrow in FIG. 2 illustrates the direction of rotation is counterclockwise. In other embodiments, the direction may be clockwise. As can be seen in DAC 12', rotating two nodes, results in VDD being provided to node N6 and ground (GND) being provided to node N2 (switches 6.1 and 2.2 are closed). As illustrated for DAC 12', a first leg now includes resistors R3-R6 and a second leg includes resistors R7, R8, R1, and R2.

In the next operating cycle, a digital value of the number one (1) is provided to DAC 12'. In thermometer code, the digital value may be 0001. Switches 3.3 and 7.4 are closed, outputting corresponding analog voltages VOUTP and VOUTN from node N3 and node N7, respectively. A differential analog voltage is then obtained from the difference of VOUTP and VOUTN.

Note that barrel shifting or other mismatch error shaping technique may be applied to DAC 12 of FIG. 2 instead of DWA. Also, DAC 12 can be made to provide a single-ended output voltage instead a differential output voltage.

Using a differential output with data weighted averaging as illustrated in FIG. 2 provides a relatively high signal-to-noise distortion ratio (SNDR) compared to DAC 10 with the single-ended output. However, if switch resistance mismatch induced in-band noise is still too high, the problem can be solved by regulating reference voltages VDD and GND in both legs of the resistor ladder as illustrated in FIG. 3 as discussed below.

Figure 3:
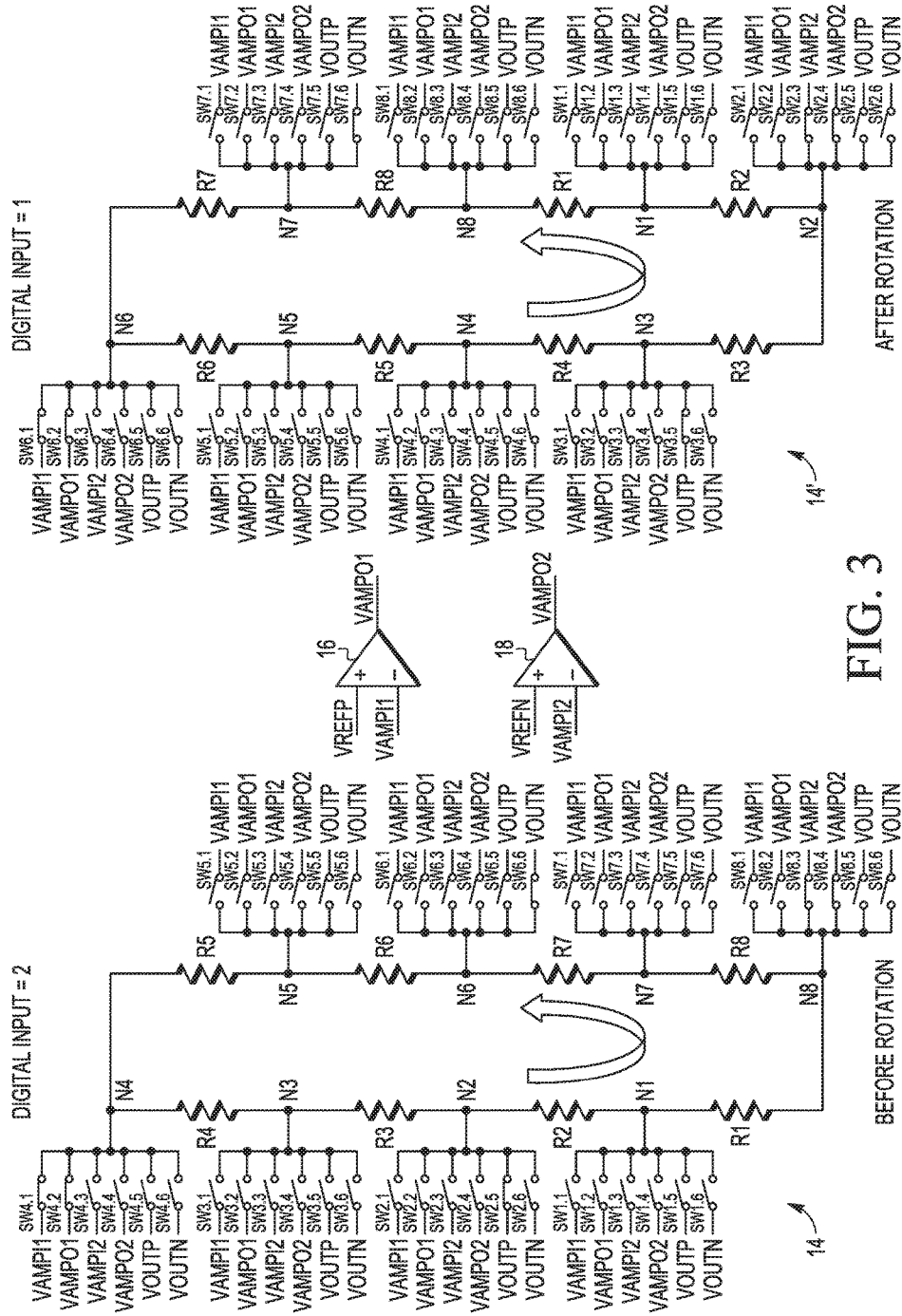
FIG. 3 illustrates resistor ladder DAC with a differential output and voltage regulation, and example switch positions before and after applying data weighted averaging according to an embodiment.

FIG. 3 illustrates resistor ladder DAC 14 with differential outputs and voltage regulation, and example switch positions before and after applying DWA according to an embodiment. DAC 14 is similar to DAC 12 except that DAC 14 includes a technique for regulating the reference voltages applied to the ends of the series-resistance resistor legs. As illustrated in FIG. 1 and FIG. 2, the resistors of DAC 14 are labeled R1-R8, and the nodes between the resistors are labeled N1-N8. Amplifiers 16 and 18 are illustrated for providing the voltage regulation for the reference voltages. In other embodiments, a different voltage regulation technique may be used. Also, DAC 14 differs from DAC 12 in that DAC 14 has four terminals for selectively connecting amplifiers 16 and 18 to any of the nodes for providing the reference voltages. A plurality of switches are connected in series between each of nodes N1-N8 and an output terminal. Using the plurality of switches, each node can be selectively coupled to input terminal VAMPI1 of amplifier 16, output terminal VAMPO1 of amplifier 16, input terminal VAMPI2 of amplifier 18, output terminal VAMPO2 of amplifier 18, DAC output terminal VOUTP, and DAC output terminal VOUTN. A DAC control circuit (not shown) is provided for controlling the switches. Using the switches, the regulated reference voltages VAMPO1 and VAMPO2 can be assigned to any of the terminals and any of the nodes N1-N8 can be connected as the analog voltage output.

As discussed above for FIG. 1 and FIG. 2, the ringed arrangement of resistors facilitates the use of mismatch correction algorithms that reduce or eliminate the effect of mismatches in the resistances values. FIG. 3 provides an example of DWA mismatch correction for a resistor ladder providing a differential output and having voltage regulation. Operation of DAC 14 is illustrated by showing two operating cycles, one is labeled "BEFORE ROTATION" and the other is labeled "AFTER ROTATION".

Amplifier 16 is used to provide a simple voltage regulator by comparing an input voltage VAMPI1 (−) to a reference voltage VREFP (+) to provide a regulated output voltage VAMPO1. Likewise, amplifier 18 is used to provide a simple voltage regulator by comparing an input voltage VAMPI2 (−) to a reference voltage VREFN (+) to provide a regulated output voltage VAMPO2. The amplifiers provide voltage regulation that cause the reference voltages to be relatively constant. The relatively constant reference voltages reduces or eliminates mismatch in the switches that connect the reference voltage to the two legs of resistors.

During a first operating cycle of DAC 14 (BEFORE ROTATION), switches 4.1 and 4.2 are closed. Switch 4.2 connects the output terminal VAMPO1 of amplifier 16 to node N4 as a first reference voltage. Switch 4.1 connects the input terminal VAMPI1 to the output terminal of amplifier 16 providing a feedback path for voltage regulation. Switch 8.4 connects the output terminal of amplifier 18 to node N8 and switch 8.3 connects the input terminal VAMPI2 to the output terminal of amplifier 18. This effectively divides the ring of resistors forming the resistor ladder of DAC 14 into two legs of series-connected resistors between the first reference voltage VAMPO1 and the second reference voltage VAMPO2. A first leg of series-connected resistors includes resistors R1-R4 and a second leg of series-connected resistors includes resistors R5-R8. In this example, a digital value for the number two (2) is provided to control terminals of switches 2.5 and 6.6 during the first operating cycle (BEFORE ROTATION). In thermometer code, the digital value of the number two (0010) would result in switch 2.5 closing and providing VOUTP in the first leg and 6.6 closing and providing VOUTN in the second leg with the rest of the switches remaining open. At the output terminals of DAC 14, differential analog voltages VOUTP and VOUTN are provided. A differential analog voltage VOUT corresponding to the number two (2) is determined by a difference of the output voltages VOUTP and VOUTN.

Prior to a second operating cycle, the locations of the bit positions are rotated in accordance with the DWA rotating scheme. In DWA, the nodes are rotated by a number determined by the previous data value. In this case, the data value was equal to the number two in the first operating cycle, so the nodes are rotated by two nodes in a counterclockwise direction as illustrated in DAC 12' (AFTER ROTATION). A curved arrow in FIG. 2 illustrates the direction of rotation is counterclockwise. In other embodiments, the direction of rotation may be clockwise. Also in other embodiments, barrel shifting or other mismatch error shaping technique may be applied to DAC 14 instead of DWA. As can be seen in DAC 14', rotating by two nodes results in the first reference voltage VAMPO1 being provided to node N6 and the second reference voltage VAMPO2 being provided to node N2. As illustrated, a first leg now includes nodes R3-R6 and a second leg includes nodes R7, R8, R1, and R2.

In the next operating cycle after rotation, a data value of the number one (1) is provided to DAC 14'. In thermometer code, the second input digital value may be 0001 as provided by a binary-to-thermometer decoder (not shown). Switches 3.5 and 7.6 are closed, outputting corresponding analog voltages VOUTP and VOUTN from node N3 and node N7, respectively. A differential voltage is then obtained from the difference of VOUTP and VOUTN.

Using a differential output with DWA and voltage regulation as illustrated in FIG. 3 provides mismatch correction for the resistors and switches, and provides a relatively high signal-to-noise distortion ratio (SNDR) with improved harmonic distortion. The illustrated embodiments convert harmonic distortion into white or shaped noise, eliminating harmonic content in the output signal. Examples of output node rotation using barrel shifting and DWA has been shown. In other embodiments, other element matching techniques can be applied. Examples include two-way DWA, higher order DWA, barrel shifting with a shift larger than 2 per cycle, and the like.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. Generally, in the above described embodiment, a current electrode is a source or drain and a control electrode is a gate of a metal-oxide semiconductor (MOS) transistor. Other transistor types may be used in other embodiments.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A digital-to-analog converter (DAC) comprising:
a plurality of series-connected resistive elements connected together to form a ring of resistive elements;
a first plurality of switches, each switch of the first plurality of switches having a first terminal and a second terminal, the first terminal of each of the first plurality of switches coupled to a corresponding node between adjacent resistive elements of all of the plurality of series-connected resistive elements, and the second terminal of each switch of the first plurality of switches coupled to receive a first reference voltage;
a second plurality of switches, each switch of the second plurality of switches having a first terminal and a second terminal, the first terminal of each of the second plurality of switches coupled to a corresponding node between adjacent resistive elements of all of the series-connected resistive elements, and the second terminal of each switch of the first plurality of switches coupled to receive a second reference voltage; and
a third plurality of switches, each switch of the third plurality of switches having a first terminal and a second terminal, the first terminal of each of the third plurality of switches coupled to a corresponding node between adjacent resistive elements of all of the series-connected resistive elements, and the second terminal of each switch of the third plurality of switches coupled to provide an analog voltage at an output terminal in response to a digital value.

2. The DAC of claim 1, wherein the plurality of series-connected resistive elements comprises an even number of resistive elements.

3. The DAC of claim 1, wherein the digital value is characterized as being a digital thermometer code.

4. The DAC of claim 1, wherein the first reference voltage is a power supply voltage, and the second reference voltage is ground potential.

5. The DAC of claim 1, wherein the plurality of series-connected resistive elements are characterized as being a plurality of series-connected equal valued resistors.

6. The DAC of claim 1, wherein the analog voltage is a differential analog voltage.

7. The DAC of claim 1, further comprising:
a fourth plurality of switches, each switch of the fourth plurality of switches having a first terminal and a second terminal, the first terminal of each of the fourth plurality of switches coupled to a corresponding node between adjacent resistive elements of the series-connected resistive elements, and the second terminal of each switch of the fourth plurality of switches coupled to provide a second analog voltage at a second output terminal in response to the digital value, the analog voltage and the second analog voltage together providing a differential analog voltage.

8. The DAC of claim 1, further comprising:
a fourth plurality of switches, each switch of the fourth plurality of switches having a first terminal and a second terminal, the first terminal of each of the fourth plurality of switches coupled to a corresponding node between adjacent resistive elements of the series-connected resistive elements; and
an amplifier having a first input terminal coupled to receive a third reference voltage, a second input terminal, and an output terminal for providing the first reference voltage, the output terminal of the amplifier selectively coupled to the second terminal of one of the first plurality of switches and to the second input terminal.

9. The DAC of claim 1, wherein nodes between the adjacent resistive elements are reassigned to different locations in the ring of resistive elements by rotating the nodes by a predetermined number of node positions.

10. A digital-to-analog converter (DAC) comprising:
a plurality of resistive elements connected together in series to form a ring of resistive elements, a node being formed by each of the connections of adjacent resistive elements of the plurality of resistive elements; and
a plurality of groups of switches, each of the groups of switches coupled to one node formed between the adjacent resistive elements of all of the plurality of resistive elements, a first switch of each of the group of switches for selectively coupling a first power supply voltage terminal to the node to which it is coupled, a second switch of the group of switches for selectively coupling a second power supply voltage to the node to which it is coupled, a third switch of the group of switches for selectively coupling an output terminal to the node to which it is coupled, and a fourth switch for selectively coupling a second output terminal to the node to which it is coupled, wherein the output terminal and the second output terminal selectively providing a differential analog output voltage in response to a digital value.

11. The DAC of claim 10, further comprising an amplifier selectively coupled to the first switch for providing a regulated first power supply voltage to the first power supply voltage terminal.

12. The DAC of claim 10, wherein nodes between the adjacent resistive elements of the plurality of resistive elements are reassigned to different locations in the ring of resistive elements by rotating the nodes by a predetermined number of node positions.

13. The DAC of claim 12, wherein the predetermined number of node positions is equal to one.

14. The DAC of claim 10, wherein the plurality of resistive elements is characterized as being a plurality of series-connected equal value resistors.

15. A method for operating a digital-to-analog converter (DAC), the DAC comprising a plurality of resistive elements coupled together in series to form a ring of resistive elements with a ring of nodes, each node of the ring of nodes at a corresponding connection between resistive elements of the plurality of resistive elements, the method comprising:
selectively coupling a first node of the ring of nodes to a first power supply voltage terminal;
selectively coupling a second node of the ring of nodes to a second power supply voltage terminal;
selectively coupling a third node of the ring of nodes to output a first analog voltage corresponding to a first digital input value;
re-assigning each of the first node, the second node, and the third node to different locations in the ring of resistive elements by rotating the first, second, and third nodes by a predetermined number of nodes, wherein the first node is a new first node, the second node is a new second node, and the third node is a new third node;
selectively coupling the new first node of the nodes to the first power supply voltage terminal;
selectively coupling the new second node of the nodes to the second power supply voltage terminal; and
selectively coupling the new third node of the nodes to output a second analog voltage corresponding to a second digital input value.

16. The method of claim 15, wherein rotating the first, second, and third nodes by a predetermined number of nodes further comprises rotating the first, second, and third nodes by one node in a predetermined direction.

17. The method of claim 15, wherein rotating the first, second, and third nodes by a predetermined number of nodes further comprises the predetermined number of nodes corresponding to the first digital input value.

18. The method of claim 15, further comprising regulating a first power supply voltage provided to the first power supply voltage terminal, and regulating a second power supply voltage provided to the second power supply voltage terminal.

19. The method of claim 15, wherein the first and second analog voltages are each characterized as being a differential analog voltage.

* * * * *